United States Patent [19]
Kovacs

[11] Patent Number: 5,373,400
[45] Date of Patent: Dec. 13, 1994

[54] DYNAMIC THRESHOLD UPDATING CIRCUIT FOR A MAXIMUM LIKELIHOOD DETECTOR USING BOTH POSITIVE AND NEGATIVE COMPARATORS

[75] Inventor: Janos Kovacs, N. Andover, Mass.

[73] Assignee: Analog Devices, Inc., Norwood, Mass.

[21] Appl. No.: 161,047

[22] Filed: Dec. 1, 1993

[51] Int. Cl.$^5$ .................. G11B 5/09; H03K 5/153; H03D 1/00; H04L 27/06
[52] U.S. Cl. ........................ 360/46; 375/94; 327/62; 327/74
[58] Field of Search ............ 360/46, 40, 53; 375/94; 307/360, 359, 351

[56] References Cited

U.S. PATENT DOCUMENTS

| | | | |
|---|---|---|---|
| 3,593,334 | 7/1971 | Bickel | 360/40 |
| 3,921,210 | 11/1975 | Halpern | 360/40 |
| 4,346,411 | 8/1982 | Buhler et al. | 360/46 |
| 4,504,872 | 3/1985 | Petersen | 360/40 |
| 4,634,896 | 1/1987 | Shrinkle | 307/351 |
| 4,965,811 | 10/1990 | Sparks | 375/109 |
| 5,121,263 | 6/1992 | Kerwin et al. | 360/53 |

*Primary Examiner*—John Shepperd
*Assistant Examiner*—Patrick Wamsley
*Attorney, Agent, or Firm*—Iandiorio & Teska

[57] ABSTRACT

A maximum likelihood detector for a continuous time disk drive read channel includes a dynamic threshold updating circuit for a maximum likelihood detector using both positive and negative comparators for detecting the positive and negative peaks of an input signal; this includes comparing the input signal with at least one present dynamic threshold to produce positive and negative binary gating signals; a control circuit responsive to the binary gating signals, to the input signal, and to the peak detector circuit which identifies qualified input signal peaks; and a threshold update circuit responsive to the identification of qualified input signal peaks, which adjusts the present dynamic threshold by the difference between the input signal and the present dynamic threshold to obtain the next dynamic threshold.

11 Claims, 2 Drawing Sheets

DYNAMIC THRESHOLD UPDATING CIRCUIT FOR A MAXIMUM LIKELIHOOD DETECTOR USING BOTH POSITIVE AND NEGATIVE COMPARATORS

FIELD OF INVENTION

This invention relates to a dynamic threshold updating circuit, and more particularly to such a circuit for use in a maximum likelihood detector for a continuous time disk drive read channel.

BACKGROUND OF INVENTION

The ever-increasing demand for higher and higher disk storage capacity has required that the packing density of the bits be increased. With such increases the signal to noise ratio decreases, requiring ever more precision in the read out process to insure that the bits are discriminated from the noise and no information is lost. Writing into a magnetic disk is accomplished by representing each binary "1" as a transition either positive or negative going, while a "0" is represented by no transition. In the read operation a clock is regenerated and the transitions are read out synchronously with the clock signal. The noise that occurs can be reduced in one approach by thresholding the signal so that under a certain level transitions are ignored as noise. In another approach any transition which is not of the opposite polarity of the previous one is ignored as noise.

Quite apart from analog attempts to discriminate the signal from the noise, there are digital approaches too. For example, the signal read from the disk can be sampled and held and digitized. The digitized signal can then be synchronized with a regenerated clock signal. Then the signal will only be viewed at those precise clock intervals and only transitions occurring at those times will be recognized as signal or data. This approach is quite complex and costly because it requires a sample and hold circuit, an analog to digital converter and full digital processing circuits.

One of the more sophisticated digital processing approaches known as Viterbi detection tracks the path of previous decisions and calculates a running total of path metrics for use in discriminating and detection. Another approach uses multiple threshold levels to more precisely derive qualification or threshold levels for the positive and negative going peaks which represent binary "1"'s.

SUMMARY OF INVENTION

It is therefore an object of this invention to provide a dynamic threshold updating circuit which enables a maximum likelihood detector for a continuous time, disk drive read channel.

It is a further object of this invention to provide such a dynamic threshold updating circuit which avoids use of A/D converters and extensive digital signal processing.

It is a further object of this invention to provide such a dynamic threshold updating circuit which is simple and less expensive.

It is a further object of this invention to provide such a dynamic threshold updating circuit which operates in the analog domain and is faster and less complex.

It is a further object of this invention to provide such a dynamic threshold updating circuit which enables higher data packing density at lower signal to noise ratios.

The invention results from the realization that a truly simple yet extremely effective dynamic threshold updating circuit for a maximum likelihood detector can be effected by adjusting a dynamic threshold in accordance with the difference between the input signal and the present dynamic threshold to create the next dynamic threshold when a qualified input signal peak is identified.

This invention features a maximum likelihood detector for a continuous time disk drive read channel. There is a peak detector circuit for detecting the positive and negative peaks of an input signal. Comparator means compare the input signal with at least one present dynamic threshold to produce positive and negative binary gating signals. A control circuit responsive to the binary gating signals, to the input signal, and to the peak detector circuit identifies qualified input signal peaks. A threshold update circuit responsive to the identification of a qualified input signal peak adjusts the present dynamic threshold by the difference between the input signal and the present dynamic threshold to obtain the next dynamic threshold.

In a preferred embodiment the threshold update circuit may include a positive summing circuit for comparing the combination of an input signal and a negative threshold with at least one present dynamic threshold to obtain the difference. There may be a negative summing circuit for comparing the combination of an input signal and a positive threshold with at least one present dynamic threshold to obtain the difference. Alternatively, the positive summing circuit may compare the input signal with a combination of a predetermined positive threshold and the at least one present dynamic threshold to obtain the difference and the negative summing circuit may compare the input signal with a combination of a predetermined negative threshold and said at least one present dynamic threshold to obtain the difference. There may also be an adder circuit selectively responsive to one of the summing circuits and the present dynamic threshold to generate an updated dynamic threshold. A holding circuit responsive to the updated dynamic threshold produces the next present dynamic threshold.

The invention also features a dynamic threshold updating circuit for a maximum likelihood detector for a continuous time, disk drive read channel, including a positive summing circuit for comparing an input signal with a combination of a predetermined positive threshold and at least one present dynamic threshold to obtain the difference. There is a negative summing circuit for comparing an input signal with a combination of a predetermined negative threshold and at least one present dynamic threshold to obtain the difference. An adder circuit selectively responds to one of the summing circuits and the present dynamic threshold to generate an updated dynamic threshold and a holding circuit is responsive to the updated dynamic threshold for producing the next present dynamic threshold.

In a preferred embodiment the positive and negative summing circuits may each include an adder for combining the present dynamic threshold with the positive and negative thresholds, respectively. The adder circuit may include an adder device and switching means for selectively providing the difference output from the positive and negative summing circuits to the adder device for combining with the present dynamic threshold. The holding circuit may include a sample and hold circuit or may include a track and hold circuit.

The invention also features a maximum likelihood detector for a continuous time, disk drive read channel which includes a positive comparator circuit for comparing an input signal with a combination of a predetermined positive threshold and a present dynamic threshold to produce a positive binary gating signal. There is also a negative comparator circuit for comparing an input signal with a combination of a predetermined negative threshold and a present dynamic threshold to produce a negative binary gating signal. There is a peak detection circuit and a control circuit responsive to the peak detection circuit for providing qualified input signal peaks upon the coincidence of the detection of a peak signal by the peak detector circuit and a gating signal from one of the comparator circuits. The control circuit includes a positive summing circuit for comparing an input signal with a combination of a predetermined positive threshold and at least one present dynamic threshold to obtain the difference, and A negative summing circuit for comparing an input signal with a combination of a predetermined negative threshold to obtain the difference. There is an adder circuit selectively responsive to one of the summing circuits and the present dynamic threshold to generate an updated dynamic threshold, and a holding circuit responsive to the updated dynamic threshold for producing the next dynamic threshold.

In a preferred embodiment the positive and negative summing circuits may each include an adder for combining the present dynamic threshold with the positive and negative thresholds, respectively. The adder circuit may include an adder device and switching means for selectively providing the difference output from the positive and negative summing circuits to the adder device for combining with the present dynamic threshold. The holding circuit may include a sample and hold circuit or a track and hold circuit. Alternatively, the positive summing circuit may compare the input signal with a combination of a predetermined positive threshold and said at least one present dynamic threshold to obtain the difference and the negative summing circuit may compare the input signal with a combination of a predetermined negative threshold and said at least one present dynamic threshold to obtain the difference.

DISCLOSURE OF PREFERRED EMBODIMENT

Other objects, features and advantages will occur to those skilled in the art from the following description of a preferred embodiment and the accompanying drawings, in which.

Figure 1:
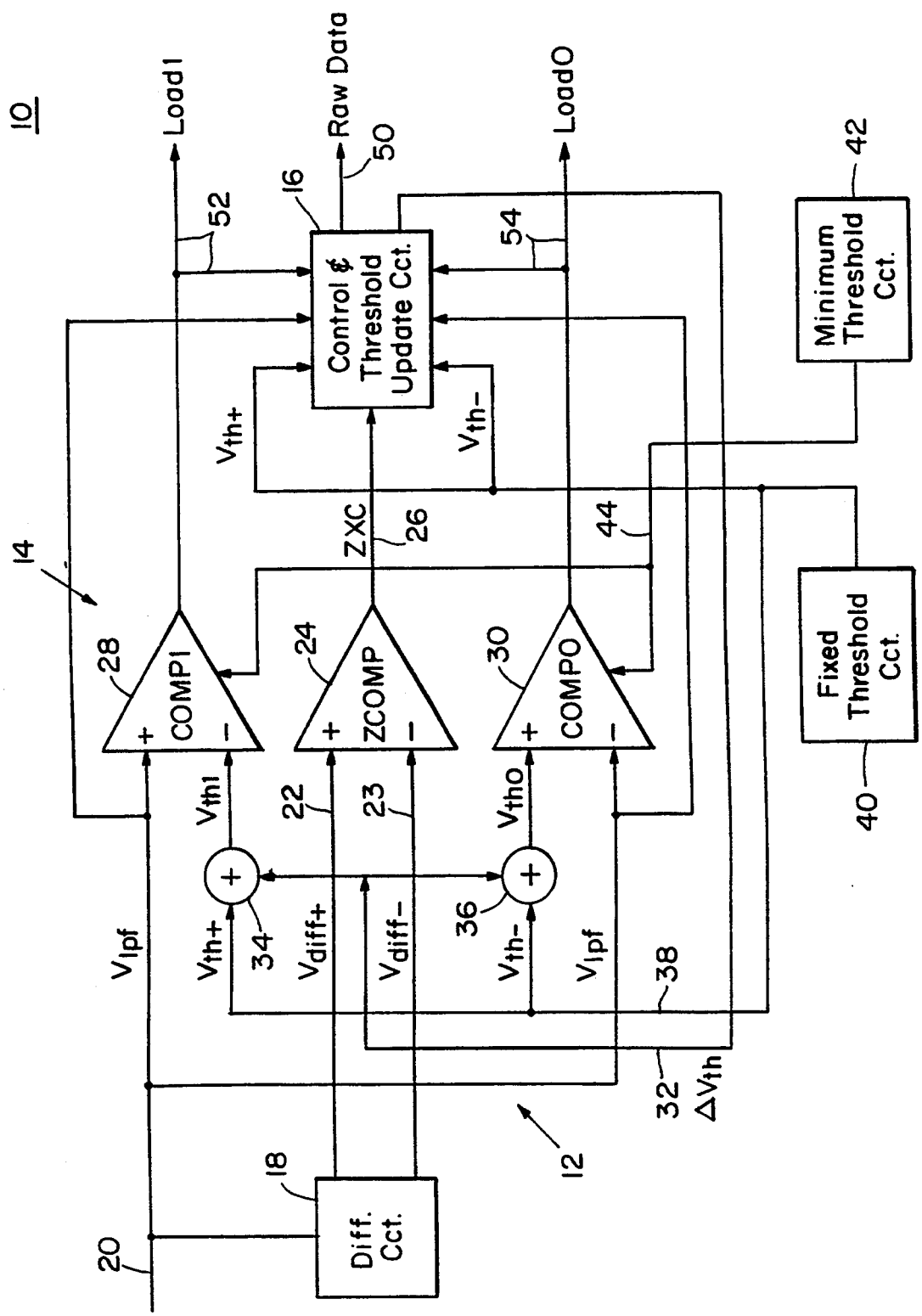
FIG. 1 is a schematic diagram of a maximum likelihood detector for a continuous time disk drive read channel with a dynamic threshold updating circuit according to this invention.

There is shown in FIG. 1 a maximum likelihood detector for a continuous time disk drive read channel 10 according to this invention. It includes a peak detection circuit 12, a comparing circuit 14, and a control and threshold update circuit 16. Peak detecting circuit 12 includes a differentiating circuit 18 which is responsive to the input signal $V_{lpf}$ on line 20 to produce a differential signal on lines 22 and 23 which represent the positive and negative peaks of the input signal. This differential signal is provided to the zero crossing circuit 24 which in turn identifies the zero crossing of the positive and negative peaks and provides a signal representative thereof on line 26 to the control and threshold update circuit 16. The comparing circuit 14 includes a positive comparator 28 and negative comparator 30. Positive comparator 28 receives the input signal from line 20 at its positive input and its negative input receives a threshold input $V_{th1}$ which is a combination of a fixed once adjusted threshold $V_{th+}$ and the present dynamic threshold $\Delta V_{th}$ on line 32. The fixed once adjusted threshold $V_{th+}$ and the dynamic threshold $\Delta V_{th}$ are combined in adder 34. Comparator 30 receives input signal $V_{lpf}$ from line 20 at its negative input, and its positive input receives the same fixed threshold $V_{th}$, but of the opposite polarity, $V_{th-}$, which is combined in adder 36 with the dynamic threshold $\Delta V_{th}$ on line 32 to provide the combined threshold $V_{th0}$ at the positive terminal of comparator 30. The fixed once adjusted threshold $V_{th+}$ provided on line 38 is derived from the adjustable threshold circuit 40 which for example may De a programmable device. An additional thresholding signal is provided by the minimum threshold circuit 42 on line 44. This signal is provided to both comparators 28 and 30 and simply limits the lowest threshold it can experience by those comparators so that they do not dither or hunt about the zero level due to noise as the circuit alternates between the positive and negative operations.

In operation, zero crossing circuit 24 provides a signal to control and threshold update circuit 16 every time a peak is detected, even though some of those peaks may actually be noise and not data. However, the control and threshold update circuit 17 do not deliver all of the incoming signals as raw data on its output line 50: rather, only those signals will be considered as raw data which represent the coincidence of a zero crossing signal on line 26 and either a load I signal appearing on line 52 or a load 0 signal appearing on line 54.

Figure 2:
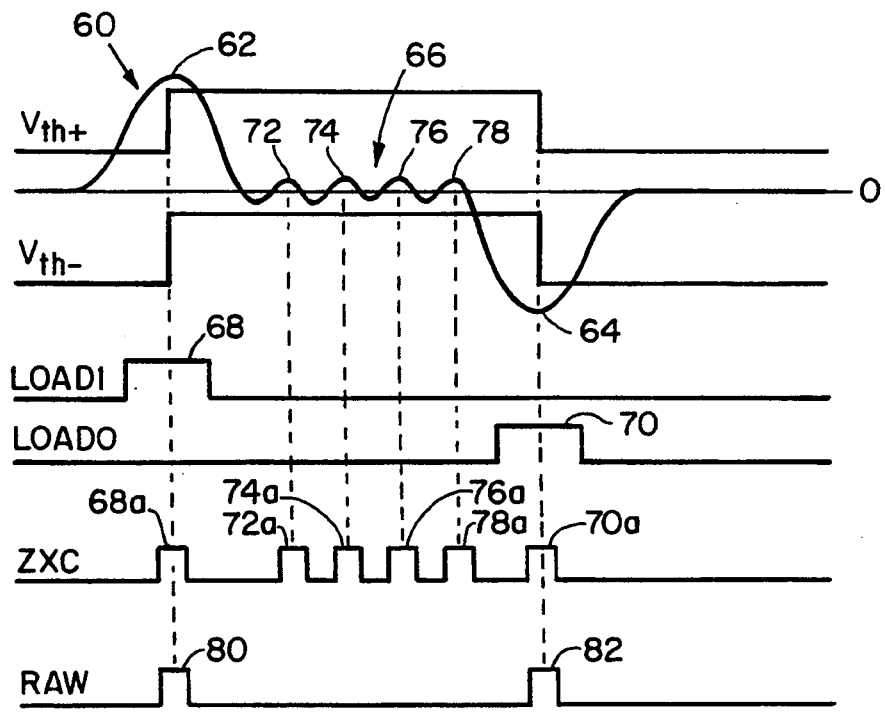
FIG. 2 illustrates the waveform that occur in the detection of FIG. 1.

As illustrated in FIG. 2, the input signal 60, FIG. 2, which appears on line 20, FIG. 1, typically includes alternate positive-going 62 and negative-going 64 peaks. Each peak, whether it be positive- or negative-going, represents a transition and therefore represents a binary 1. An absence of transition such as the area 66 between peaks 62 and 64 represents a 0. Since peak 62 is above threshold $V_{th+}$ and since peak 64 is below negative threshold $V_{th-}$, both of those peaks will be recognized by the respective positive and negative comparators 28 and 30, and so a load 1 signal 68 and a load 0 signal 70, respectively, will be provided as indicated in FIG. 2. Since the four smaller noise peaks 72, 74, 76 and 78 are not sufficient to exceed either the $V_{th+}$ or the $V_{th-}$ thresholds, they do not provide a load 1 or load 0 signal. However, since zero crossing circuit 24 provides a signal any time a peak is detected of any size, the zero crossing output provides not only the signals 68a and 70a coincident with the load 1 and load 0 signals, respectively, but will also provide signals 72a, 74a, 76a and 78a which will be ignored because they do not coincide with the occurrence of peaks 62 and 64. Thus the raw data on line 50 as presented includes only two pulses 80 and 82 which coincide with the load 1 68 and load 0 70 signals and the zero crossings 68a and 70a, all respectively.

Figure 3:
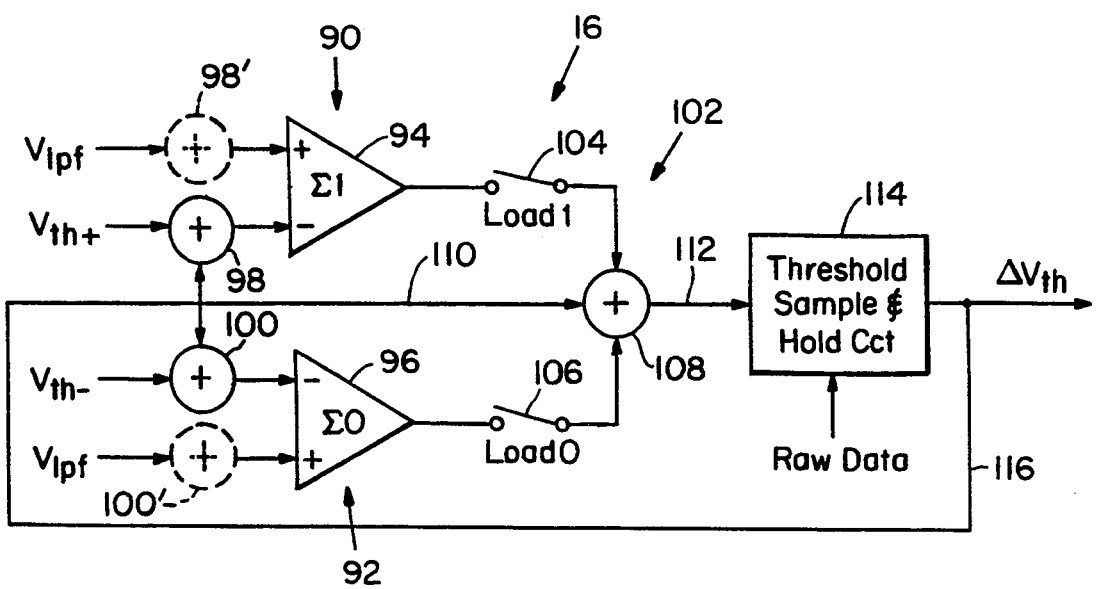
FIG. 3 is a detailed schematic diagram of the threshold update circuit of FIG. 1.

The threshold update portion of circuit 16 is shown in FIG. 3 and includes a positive summing circuit 90 and negative summing circuit 92, each of which includes summer 94, 96 and an adder 98, 100. Alternatively, the same result could be obtained by removing position adders 98 and 100 and replacing them with adders 98' and 100' associated with the inputs $V_{lpf}$. Also included in the threshold update circuit are an adder circuit 102 which includes two switching devices 104, 106, and an adder device 108. Either switch 104 or 106 will be closed and the others open depending upon whether the load signals are high or low, which in turn depends upon whether the peak occurring in the input signal is positive or negative. Whichever switch is closed, 104 or 106, the output of the associated summer is delivered to adder device 108 where it is combined with the present dynamic threshold on line 110 to create the updated dynamic threshold on line 112. This updated dynamic threshold is stored by holding circuit 114 and delivered on line 116 to become the next present dynamic threshold. Holding circuit 114 may be a conventional sample and hold circuit if a static resolution is desired, or if it is desired that the system track continuously during the updating, then a track and hold circuit can be used for holding circuit 114.

In operation, the fixed once adjusted thresholds $V_{th+}$ and $V_{th-}$ are provided to one input each of adders 98 and 100. Assuming for the moment that a positive peak is occurring on the input signal $V_{lpf}$, then summer 94 will calculate the difference between the combination of the fixed adjustable threshold and the present dynamic threshold and the value of the input signal. The difference is then added in adding device 108 to the present dynamic threshold on line 110. Any difference between the two is used to increase the present dynamic threshold signal on line 110 to create the updated dynamic threshold on line 112. When a negative peak is occurring in the input signal, summing circuit 96 is the operative circuit, switch 106 will be closed and switch 104 will be open, and the present dynamic threshold on line 110 will be decreased to obtain the updated dynamic threshold on line 112. In this way the system constantly detects the peaks, identifies the zero crossings, and constantly updates the dynamic threshold by the difference between the present dynamic threshold and the input signal to define the next present dynamic threshold. Further, this is done only at the precise moment when the analog peak has been detected so that the system is extremely precise in the way it causes the dynamic threshold to track the changes in the input signal.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A maximum likelihood detector for a continuous time, disk drive read channel, comprising:
   a dynamic threshold updating circuit for a maximum likelihood detector using both positive and negative comparators for detecting the positive and negative peaks of an input signal;
   comparator means for comparing said input signal with at least one present dynamic threshold to produce positive and negative binary gating signals;
   a control circuit responsive to said binary gating signals, the input signal, and said peak detector circuit for identifying qualified input signal peaks: and
   a threshold update circuit, responsive to the identification of an input signal peak, for adjusting the present dynamic threshold by the difference between the input signal and the present dynamic threshold to obtain the next dynamic threshold.

2. The maximum likelihood detector for a continuous time, disk drive read channel of claim 1 in which said threshold update circuit includes:
   a positive summing circuit for comparing said input signal with a combination of a predetermined positive threshold and said at least one present dynamic threshold to obtain the difference;
   a negative summing circuit for comparing said input signal with a combination of a predetermined negative threshold and said at least one present dynamic threshold to obtain the difference;
   an adder circuit selectively responsive to one of said summing circuits and said present dynamic threshold to generate an updated dynamic threshold: and
   a holding circuit responsive to said updated dynamic threshold producing the next present dynamic threshold.

3. The maximum likelihood detector for a continuous time, disk drive read channel of claim 1 in which said threshold update circuit includes:
   a positive summing circuit for comparing the combination of said input signal and a negative threshold with a said at least one present dynamic threshold to obtain the difference;
   a negative summing circuit for comparing the combination of said input signal and a positive threshold with a said at least one present dynamic threshold to obtain the difference;
   an adder circuit selectively responsive to one of said summing circuits and said present dynamic threshold to generate an updated dynamic threshold: and
   a holding circuit responsive to said updated dynamic threshold for producing the next present dynamic threshold.

4. A dynamic threshold updating circuit for a maximum likelihood detector for a continuous time, disk drive read channel, comprising:
   a positive summing circuit for comparing an input signal with a combination of a predetermined positive threshold and at least one present dynamic threshold to obtain the difference;
   a negative summing circuit for comparing said input signal with a combination of a predetermined negative threshold and at least one present dynamic threshold to obtain the difference;
   an adder circuit selectively responsive to one of said summing circuits and said present dynamic threshold to generate an updated dynamic threshold; and
   a holding circuit responsive to said updated dynamic threshold for producing the next present dynamic threshold.

5. The dynamic threshold updating circuit of claim 4 in which said positive and negative summing circuits each includes an adder for combining said present dynamic threshold with said positive and negative thresholds, respectively.

6. The dynamic threshold updating circuit of claim 4 in which said adder circuit includes an adder device and switching means for selectively providing the difference output from said positive and negative summing circuits to said adder device for combining with said present dynamic threshold.

7. The dynamic threshold updating circuit of claim 4 in which said holding circuit includes a sample and hold circuit.

8. The dynamic threshold updating circuit of claim 4 in which said holding circuit includes a track and hold circuit.

9. A maximum likelihood detector for a continuous time, disk drive read channel comprising:
a positive comparator circuit for comparing an input signal with a combination of a predetermined positive threshold and a present dynamic threshold to produce a positive binary gating signal;
a negative comparator circuit for comparing an input signal with a combination of a predetermined negative threshold and a present dynamic threshold to produce a negative binary gating signal;
a peak detection circuit;
a control circuit responsive to said peak detector circuit for providing qualified input signal peaks upon the coincidence of the detection of a peak signal by said peak detector circuit and a gating signal from one of said comparator circuits; said control circuit including
a positive summing circuit for comparing said input signal with a combination of a predetermined positive threshold and said at least one present dynamic threshold to obtain the difference; a negative summing circuit for comparing said input signal with a combination of a predetermined negative threshold and said at least one present dynamic threshold to obtain the difference; an adder circuit selectively responsive to one of said summing circuits and said present dynamic threshold to generate an updated dynamic threshold; and a holding circuit responsive to said updated dynamic threshold for producing the next present dynamic threshold.

10. The maximum likelihood detector for a continuous time, disk drive read channel of claim 8 in which said positive and negative comparator circuits each include an adder system for combining said present dynamic threshold with said positive and negative thresholds.

11. Maximum likelihood detector for a continuous time, disk drive read channel of claim 9 in which said peak detection circuit includes a differentiator circuit for generating zero crossings at the peaks of the input signal and a zero crossing detection circuit for detecting those zero crossings at the peak.

* * * * *